United States Patent
Sun et al.

(10) Patent No.: US 10,573,719 B2
(45) Date of Patent: *Feb. 25, 2020

(54) HORIZONTAL GATE ALL AROUND DEVICE ISOLATION

(71) Applicant: Applied Materials, Inc., Santa Clara, CA (US)

(72) Inventors: Shiyu Sun, Santa Clara, CA (US); Naomi Yoshida, Sunnyvale, CA (US); Theresa Kramer Guarini, San Jose, CA (US); Sung Won Jun, San Jose, CA (US); Benjamin Colombeau, Salem, MA (US); Michael Chudzik, Mountain View, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/279,257

(22) Filed: Sep. 28, 2016

(65) Prior Publication Data
US 2017/0018624 A1 Jan. 19, 2017

Related U.S. Application Data

(63) Continuation of application No. 14/755,099, filed on Jun. 30, 2015, now Pat. No. 9,460,920.
(Continued)

(51) Int. Cl.
*H01L 21/76* (2006.01)
*H01L 29/423* (2006.01)
(Continued)

(52) U.S. Cl.
CPC .... *H01L 29/42392* (2013.01); *H01L 21/0228* (2013.01); *H01L 21/0245* (2013.01);
(Continued)

(58) Field of Classification Search
CPC ......... H01L 24/42392; H01L 29/66795; H01L 21/02587; H01L 21/02532;
(Continued)

(56) References Cited

U.S. PATENT DOCUMENTS 5,576,221 A * 11/1996 Takemura ............... B82Y 20/00
257/E27.127
5,595,928 A * 1/1997 Lu ...................... H01L 27/10805
257/E21.008
(Continued)

OTHER PUBLICATIONS

Cheng et al., Bottom oxidation through STI (BOTS)—A Novel Approach to Fabricate Dielectric Isolated FinFETs on Bulk Substrates, 2014 Symposium on VLSI Technology Digest of Technical Papers, 2014 IEEE, 2 pages.
(Continued)

*Primary Examiner* — Jarrett J Stark
(74) *Attorney, Agent, or Firm* — Patterson + Sheridan LLP

(57) ABSTRACT

Embodiments described herein generally relate to methods and apparatus for horizontal gate all around (hGAA) isolation. A superlattice structure comprising different materials arranged in an alternatingly stacked formation may be formed on a substrate. The different materials may be silicon containing materials and one or more III/V materials. In one embodiment, at least one of the layers of the superlattice structure may be oxidized to form a buried oxide layer adjacent the substrate.

19 Claims, 5 Drawing Sheets

Related U.S. Application Data

(60) Provisional application No. 62/159,715, filed on May 11, 2015.

(51) Int. Cl.
*H01L 21/02* (2006.01)
*H01L 21/306* (2006.01)
*H01L 21/762* (2006.01)
*H01L 29/66* (2006.01)
*H01L 29/786* (2006.01)
*H01L 29/15* (2006.01)

(52) U.S. Cl.
CPC .. *H01L 21/02236* (2013.01); *H01L 21/02247* (2013.01); *H01L 21/02255* (2013.01); *H01L 21/02271* (2013.01); *H01L 21/02381* (2013.01); *H01L 21/02507* (2013.01); *H01L 21/02532* (2013.01); *H01L 21/30604* (2013.01); *H01L 21/76224* (2013.01); *H01L 29/66742* (2013.01); *H01L 29/78696* (2013.01); *H01L 29/15* (2013.01); *H01L 29/157* (2013.01); *H01L 29/158* (2013.01)

(58) Field of Classification Search
CPC ......... H01L 21/02664; H01L 21/76224; H01L 21/02236; H01L 21/02247; H01L 21/02255; H01L 21/02271; H01L 21/0228; H01L 21/02381; H01L 21/0245; H01L 21/02507; H01L 21/30604; H01L 21/823431; H01L 21/823821; H01L 21/845; H01L 27/0886; H01L 27/0924; H01L 27/10826; H01L 27/10879; H01L 27/1211; H01L 29/41791; H01L 29/6679–29/66818; H01L 29/795–29/7856; H01L 29/04–29/045; H01L 29/18–29/185; H01L 29/22–29/206; H01L 29/36–29/365; H01L 2924/13067
USPC ................................ 438/437, 439, 442, 452
See application file for complete search history.

(56) References Cited

U.S. PATENT DOCUMENTS

| | | | |
|---|---|---|---|
| 8,304,306 B2* | 11/2012 | Cai | H01L 21/823462 438/199 |
| 8,735,869 B2 | 5/2014 | Cappellani et al. | |
| 8,987,794 B2 | 3/2015 | Rachmady et al. | |
| 9,460,920 B1* | 10/2016 | Sun | H01L 29/66795 |
| 2004/0238885 A1* | 12/2004 | Bedell | H01L 21/26506 257/347 |
| 2007/0032020 A1* | 2/2007 | Grebs | H01L 29/407 438/272 |
| 2008/0067499 A1* | 3/2008 | Maa | B82Y 20/00 257/15 |
| 2008/0251843 A1* | 10/2008 | Nakajima | H01L 27/108 257/347 |
| 2010/0163842 A1* | 7/2010 | Lai | H01L 29/66795 257/19 |
| 2013/0320399 A1* | 12/2013 | Chang | H01L 29/7848 257/190 |
| 2015/0028426 A1 | 1/2015 | Ching et al. | |
| 2015/0035071 A1* | 2/2015 | Ching | H01L 27/092 257/369 |
| 2015/0137237 A1* | 5/2015 | Jacob | H01L 29/785 257/347 |
| 2015/0263095 A1* | 9/2015 | Chan | H01L 29/155 257/17 |

OTHER PUBLICATIONS

Office Action for Taiwan Application No. 105114153 dated Sep. 23, 2019.
Search Report for Taiwan Application No. 105114153 dated Sep. 22, 2019.

* cited by examiner

HORIZONTAL GATE ALL AROUND DEVICE ISOLATION

CROSS-REFERENCE TO RELATED APPLICATIONS

This application is a continuation of U.S. patent application Ser. No. 14/755,099, filed Jun. 30, 2015, which claims benefit of U.S. Provisional Patent Application No. 62/159,715, filed May 11, 2015, both of which are hereby incorporated by reference in their entirety.

BACKGROUND

Field

Embodiments of the present disclosure generally relate to semiconductor devices. More specifically, embodiments described herein relate to horizontal gate all around device structures and methods for forming horizontal gate all around device structures.

Description of the Related Art

As the feature sizes of transistor devices continue to shrink to achieve greater circuit density and higher performance, there is a need to improve transistor device structure to improve electrostatic coupling and reduce negative effects such as parasitic capacitance and off-state leakage. Examples of transistor device structures include a planar structure, a fin field effect transistor (FinFET) structure, and a horizontal gate-all-around (hGAA) structure. The hGAA device structure includes several lattice matched channels suspended in a stacked configuration and connected by source/drain regions.

However, challenges associated with hGAA structures include the existence of a parasitic device at the bottom of the stacked lattice matched channels. Conventional approaches to mitigate the effects of the parasitic device include the implantation of dopants into the parasitic device to suppress leakage of the device. However, a dosage of the dopants required to suppress the leakage may hinder epitaxial growth of device structures on the parasitic device. In addition, implantation may not adequately reduce parasitic capacitance. Another conventional approach utilizes thermal oxidation of a highly doped parasitic device. However, thermal oxidation processes generally require temperatures beyond the thermal budgets of the stacked lattice matched channels.

Accordingly, what is needed in the art are improved methods for forming hGAA device structures.

SUMMARY

In one embodiment, a method of forming a semiconductor device is provided. The method includes forming a superlattice structure on a substrate. The superlattice structure may include a first material layer, a second material layer, and a third material layer. The superlattice structure may be patterned and the superlattice structure and substrate may be etched. A liner deposition process may be performed to deposit a liner on the superlattice structure. A shallow trench isolation process may be performed to deposit an oxide material layer on the substrate. An annealing process may be performed to oxidize at least one or the first material layer, the second material layer, or the third material layer to form a buried oxide layer.

In another embodiment, a method of forming a semiconductor device is provided. The method includes forming a superlattice structure on a substrate. The superlattice structure may include a silicon material layer, a low germanium content silicon germanium material layer, and a high germanium content silicon germanium silicon germanium layer. The superlattice structure may be patterned and the superlattice structure and substrate may be etched. A liner deposition process may be performed to deposit an oxynitride liner on the superlattice structure. A shallow trench isolation process may be performed to deposit an oxide material layer on the substrate. An annealing process may be performed to oxidize the high germanium content silicon germanium layer to form a buried oxide layer.

In yet another embodiment, a method of forming a semiconductor device is provided. The method includes forming a superlattice structure on a substrate. The superlattice may include a silicon material layer, a first silicon germanium material layer comprising about 30% germanium, and a second silicon germanium material layer comprising about 70% germanium. The silicon material layer, the first silicon germanium layer, and the second silicon germanium layer may be disposed in a stacked arrangement. A liner deposition process may be performed to deposit an oxynitride liner on the superlattice structure. A shallow trench isolation process may be performed to deposit an oxide material layer on the substrate. An annealing process may be performed to oxidize the second silicon germanium material layer to form a buried oxide layer. A shallow trench isolation recess process may also be performed.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally relate to methods and apparatus for horizontal gate all around (hGAA) isolation. A superlattice structure comprising different materials arranged in an alternatingly stacked formation may be formed on a substrate. The different materials may be silicon containing materials and one or more III/V materials. In one embodiment, at least one of the layers of the superlattice structure may be oxidized to form a buried oxide layer adjacent the substrate.

In one example, the superlattice structure may include one or more silicon containing material layers and one or more silicon germanium (SiGe) containing material layers disposed in an alternating stacked arrangement. At least one of the SiGe layers may have a higher germanium content when compared to other SiGe layers in the superlattice structure. The higher germanium content SiGe layer may be oxidized to form a buried oxide layer to provide for improved device isolation in an hGAA architecture. As a result, a substantially defect free stacked channel structure which can provide a geometric benefit in the current density per square micrometer of surface area on a substrate may be achieved. Accordingly, circuit density may be increased and parasitic capacitance may be reduced.

Figure 1:
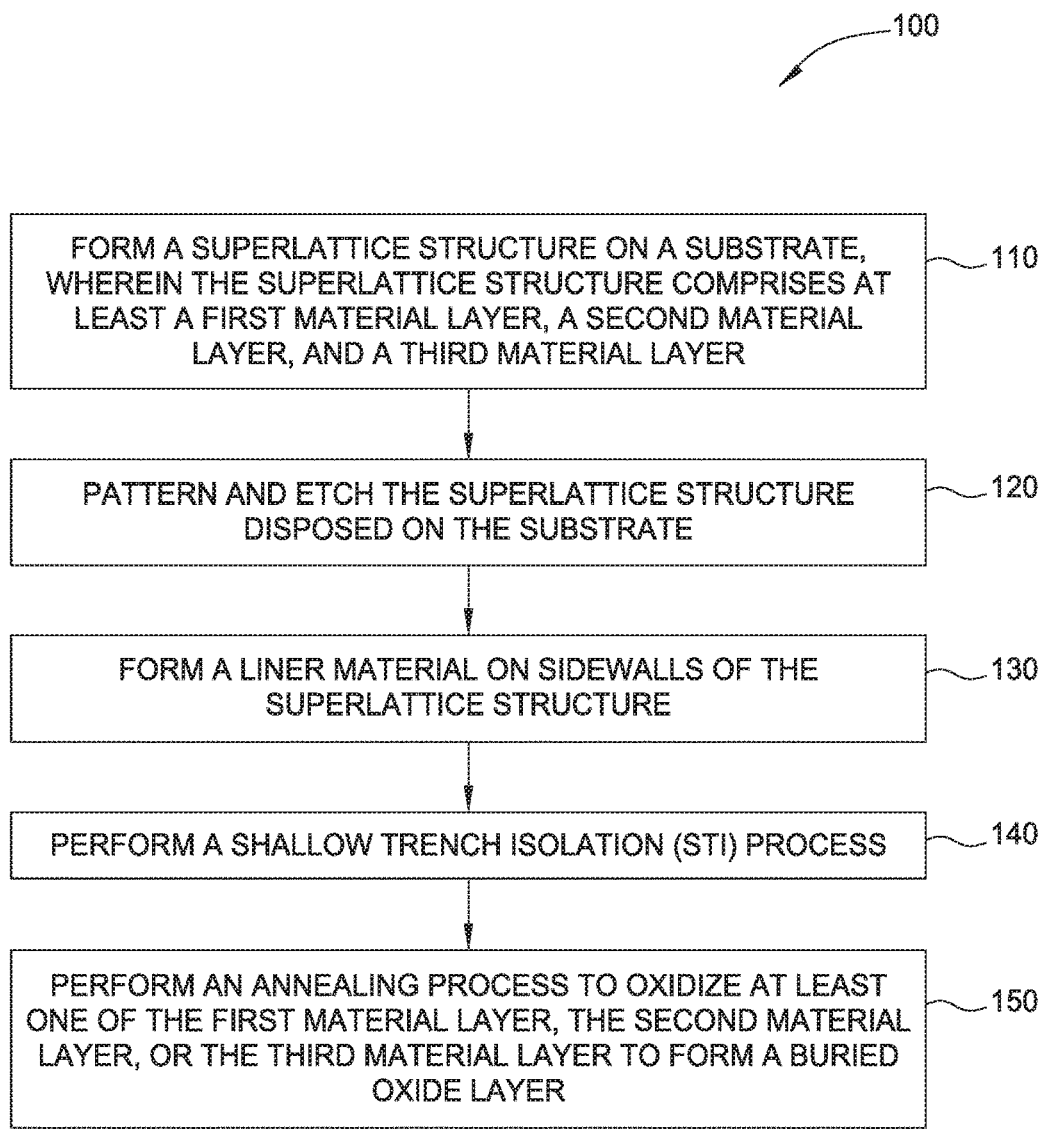
FIG. 1 illustrates operations of a method for forming a buried oxide material in an hGAA structure.

FIG. 1 illustrates operations of a method 100 for forming a buried oxide material in an hGAA structure. The method 100 may be part of a multi-operation fabrication process of a semiconductor device, for example, a hGAA device. At operation 110, a superlattice structure may be formed on a substrate. The term superlattice, as utilized herein, generally refers to a stack of material layers which are closely lattice matched materials, but are sufficiently different in composition that selective removal processes may be performed on the superlattice structure. In one example, the superlattice structure may include one or more layers of a silicon containing material and a silicon germanium containing material. In one embodiment, the superlattice structure may include a first material layer and a second material layer. In another embodiment, the superlattice structure may include a first material layer, a second material layer, and a third material layer. In this embodiment, the second material layer and the third material layer may be formed from the same compound material, but may have different material properties.

At operation 120, the super lattice structure may be patterned and etched. At operation 130, a liner material may be formed on sidewalls of the superlattice structure. In one embodiment, the liner material may be deposited, for example, by a chemical vapor deposition, an atomic layer deposition, or epitaxial deposition process. In another embodiment, the liner material may be formed (i.e. grown) by suitable processes, such as thermal oxidation or thermal nitridation processes. The liner material is generally configured to repair portions of the superlattice structure which may be damaged during previous etching processes.

In one embodiment, the liner material is an oxide material, a nitride material, or an oxynitride material. For example, the liner material may be an $SiO_2$ material, an SiN material, or a SiON material. In other embodiments, the liner material may contain carbon and/or boron. For example, the liner material may be an SiCN material, an SiOCN material, an SiBN material, an SiOBN material, and/or an SiOBCN material. In another embodiment, the liner material may be a phosphosilicate glass (PSG), a borosilicate glass (BSG), or doped glass material. It is contemplated that the various aforementioned liner materials may be doped in certain embodiments.

At operation 140, a shallow trench isolation (STI) process may be performed to deposit an oxide material on the substrate. Generally, the oxide material may be formed over and around the superlattice structure. In one embodiment, the oxide material is deposited by a flowable chemical vapor deposition (CVD) process.

At operation 150, an annealing process may be performed to oxidize at least one of the first material layer, the second material layer, or the third material layer to form a buried oxide (BOX) layer. In one example, the second material layer and the third material layer are oxidized. In another example, the third material layer is oxidized. In one embodiment, the annealing process includes a steam annealing process. In another embodiment, the annealing process includes a steam annealing process and a dry annealing process.

Additional processes, such as STI planarization and recess processes may be performed subsequent to the BOX formation process. A more detailed description of the method 100 is provided in the description of FIGS. 2-7, which illustrate various stages of fabrication of a semiconductor device.

Figure 2:
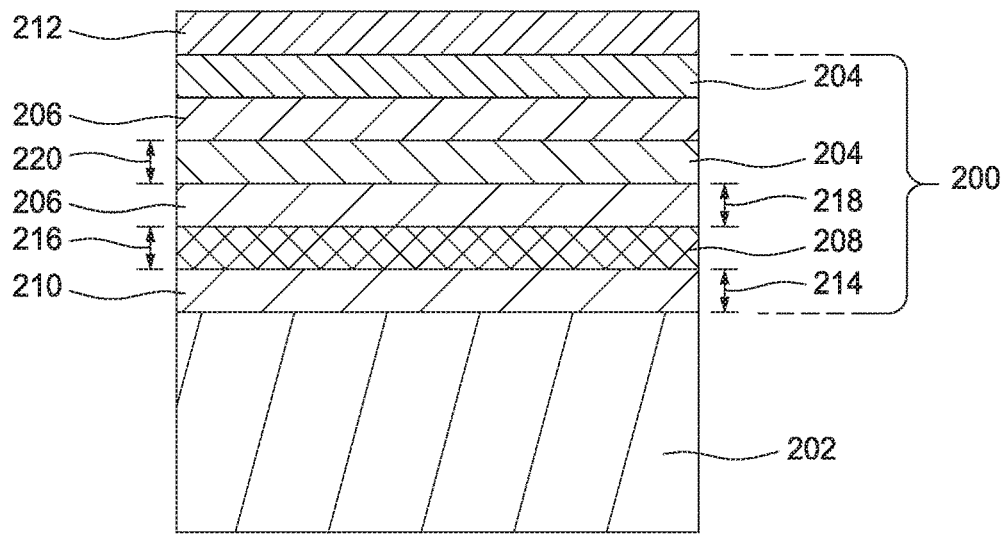
FIG. 2 illustrates a schematic, cross-sectional view of a portion of a substrate having a superlattice structure formed thereon.

FIG. 2 illustrates a schematic, cross-sectional view of a portion of a substrate 202 having a superlattice structure 200 formed thereon. In one embodiment, the substrate 202 may be a bulk semiconductor substrate. The term bulk semiconductor substrate refers to a substrate in which the entirety of the substrate is comprised of a semiconductor material. The bulk semiconductor substrate may comprise any suitable semiconducting material and/or combinations of semiconducting materials for forming a semiconductor structure. For example, the semiconducting layer may comprise one or more materials such as crystalline silicon (e.g., Si<100> or Si<111>), silicon oxide, strained silicon, silicon germanium, doped or undoped polysilicon, doped or undoped silicon substrates, patterned or non-patterned substrates, doped silicon, germanium, gallium arsenide, or other suitable semiconducting materials. In some embodiments, the semiconductor material is silicon. In some embodiments, the semiconductor material may be a doped material, such as n-doped silicon (n-Si), or p-doped silicon (p-Si).

The superlattice structure 200 includes a plurality of first layers 204 and a corresponding plurality of second layers 206 alternatingly arranged in a plurality of stacked pairs. In one embodiment, the plurality of first layers 204 may be formed from a silicon containing material. In one embodiment, the plurality of second layers 206 may be formed from at least one III-V material. Accordingly, the first layers 204 and the second layers 206 are different materials. In some embodiments, the plurality of first layers 204 and corresponding plurality of second layers 206 may be lattice matched materials with a sufficient difference in composition such that selective layer removal can subsequently be performed.

In various embodiments, the plurality of first layers 204 may include Group IV materials, such as silicon. The plurality of second layer 206 may also include Group IV materials, such as silicon germanium (SiGe). In other embodiments, the plurality of first layers 204 and the plurality of second layers 206 may include various III-V materials, such as indium-phosphorus (InP) and indium-gallium-phosphorus (InGaP), respectively. In some embodiments, the plurality of first layers 204 and the plurality of second layers 206 may be multiple pairs of lattice matched materials. In some embodiments, the plurality of first layers 204 and corresponding plurality of second layers 206 may be any number of lattice matched material pairs suitable for forming the superlattice structure 200. For example, the plurality of first layers 204 and corresponding plurality of second layers 206 may include between about 2 to about 5 pairs of lattice matched materials.

Material layer 210 and material layer 208 may also be included the in the plurality of second layers. Alternatively, material layer 208 may be considered a third material layer. Material layers 210 and 208 may be formed from the same material as the plurality of second layers 206, such as silicon germanium. However, it is contemplated that the compositional profile of the material layers 210 and 208 may differ in molar ratio of Si:Ge.

In one example, the plurality of first layers 204 and the material layer 210 have a silicon:germanium molar ratio of between about 1:1 and about 5:1. In one embodiment, the silicon germanium material of the plurality of first layers 204 and the material layer 210 may have a germanium content of between about 10% and about 50%, such as between about 20% and about 40%. The silicon content may be between about 50% and about 90%, such as between about 60% and about 80%. Alternatively, the plurality of first layers 204 may be formed from a pure silicon material. In another example, the material layer 208 has a silicon:germanium molar ratio of between about 1:1 and about 1:5. In one embodiment, the silicon germanium material of the material layer 208 may have a germanium content of between about 20% and about 100%, such as between about 60% and about 80%. The silicon content may be between about 0% and about 80%, such as between about 20% and about 40%.

The plurality of first layers 204, the plurality of second layers 206, and the material layers 210, 208 may be deposited using an epitaxial chemical vapor deposition process. Suitable precursors for forming the plurality of first layers 204, the plurality of second layers 206, and the material layers 210, 208 include $SiH_4$ and $GeH_4$, among others. In some embodiments, the plurality of first layers 204 and the plurality of second layers 206 may be deposited at a sufficiently low temperature, for example between about 300 degrees Celsius to about 750 degrees Celsius to prevent intermixing of the different atomic species. As a result, interfaces between the different atom species may be controlled which provides advantageous control of the structure during selective etching or modification processes.

The material layers of the superlattice structure 200 may have controlled thicknesses to provide for substantially defect free crystallographic profiles of the various materials. In some embodiments, the layers of the superlattice structure 200 may have a thickness of between about 3 nm and about 50 nm. For example, the plurality of first layers 204 may have a thickness 220 between about 3 nm and about 10 nm, such as between about 5 nm and 7 nm, for example, about 6 nm. The plurality of second layers 206 may have a thickness 218 if between about 5 nm and about 15 nm, such as between about 7 nm and about 10 nm, for example, about 8 nm. The material layer 210 may have a thickness 214 if between about 5 nm and about 15 nm, such as between about 8 nm and about 12 nm, for example, about 10 nm. The material layer 208 may have a thickness 216 if between about 5 nm and about 15 nm, such as between about 8 nm and about 12 nm, for example, about 10 nm.

During formation of the superlattice structure 200 on the substrate 202, the various material layers may be deposited in certain orders to manufacture one or more devices within the superlattice structure 200. In one embodiment, the material layer 210 may be disposed on the substrate 202 and the material layer 208 may be disposed on the material layer 210. In another embodiment, the material layer 210 may be optional, such that the material layer 208 is disposed on the substrate 202.

The plurality of second layers 206 and the plurality of first layers 204 may be deposited in an alternating arrangement to form a stacked structure. In this embodiment, one of the second layers 206 may be disposed on the material layer 208 and one of the first layers 204 may be disposed on the one of the second layers 206. A hardmask layer 212 may also be disposed on the superlattice structure 200. In one embodiment, the hardmask layer 212 is disposed on one of the first layers 204. The hardmask layer 212 may be any suitable hardmask material, such as a silicon nitride material or the like.

Figure 3:
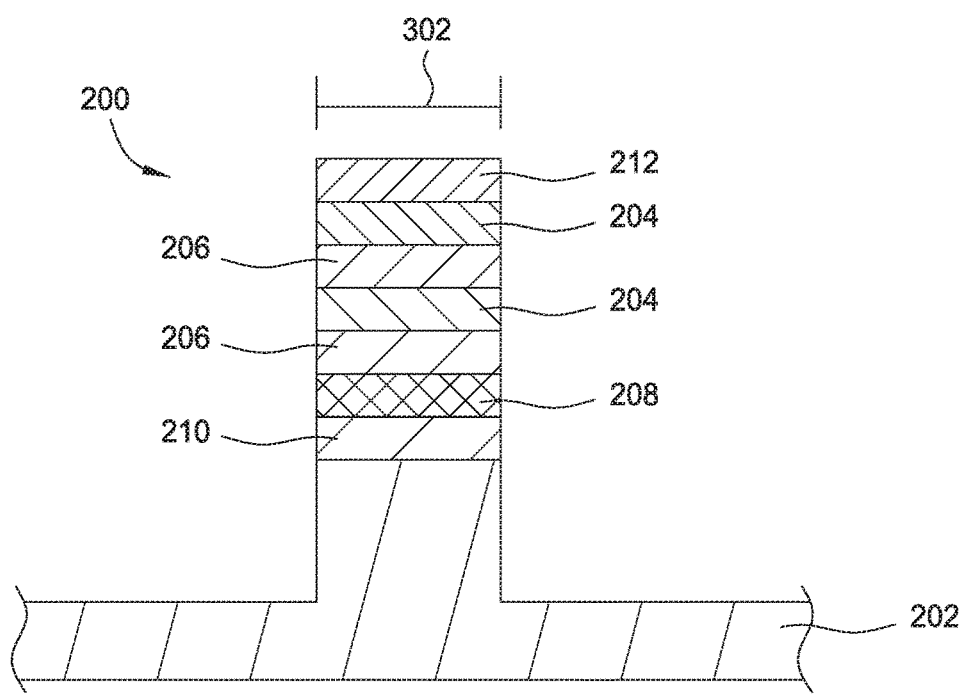
FIG. 3 illustrates a schematic, cross-sectional view of a portion of the substrate and superlattice structure of FIG. 2 after patterning and etching processes are performed.

FIG. 3 illustrates a schematic, cross-sectional view of a portion of the substrate 202 and superlattice structure 200 of FIG. 2 after patterning and etching processes are performed. In one embodiment, photolithography processes, such as extreme ultraviolet patterning processes, may be utilized to pattern the substrate 202 and the superlattice structure 200. In another embodiment, self-aligned double or quadruple patterning processes may be utilized to pattern the substrate 202 and the superlattice structure 200. The patterning processes may be configured to enable formation of the superlattice structure 200 after an etching process with a channel width 302 of between about 5 nm and about 15 nm, for example, between about 7 nm and about 10 nm.

Exemplary etching processes which may be utilized to etch the substrate 202 and the superlattice structure 200 reactive ion etching (RIE) processes or the like. In one embodiment, an RIE process may be performed utilizing a chlorine, bromine, or fluorine based chemistry to anisotropically etch the substrate 202 and the superlattice structure 200.

Figure 4:
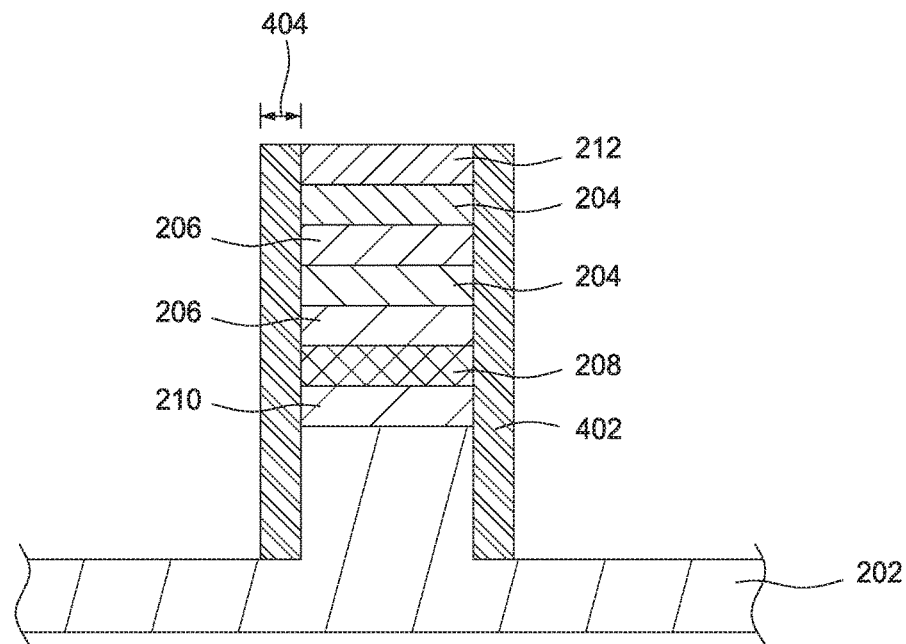
FIG. 4 illustrates a schematic, cross-sectional view of a portion of the substrate and superlattice structure of FIG. 3 after a liner formation process is performed.

FIG. 4 illustrates a schematic, cross-sectional view of a portion of the substrate 202 and superlattice structure 200 of FIG. 3 after a liner formation process is performed. During the previously described etching process, sidewalls of the superlattice structure 200 may be damaged. A liner deposition process may be performed to deposit a liner material 402 on sidewalls of the superlattice structure 200 and at least a portion of the substrate 202.

The liner material deposition process may include several distinct operations to manufacture the liner material 402. For example, a thermal oxidation process may be performed to deposit an oxide material on sidewalls of the superlattice structure 200 and the substrate 202. Subsequently, a nitridation process, such as a decoupled plasma nitridation process, may be performed to incorporate nitrogen in the oxide material to form an oxynitride material. The oxynitride liner material 402 may then be subjected to a post-nitridation annealing process to further incorporate the nitrogen into the oxide material. The post-nitridation annealing process may also cure defects that may exist in the liner material 402.

In one embodiment, a width 404 of the liner material 402 may be between about 5 Å and about 50 Å, such as between about 20 Å and about 30 Å, for example, about 25 Å. It is contemplated that the liner material 402 may be suitable for preventing oxidation of the superlattice structure 200 during a subsequent shallow trench isolation process.

Figure 5:
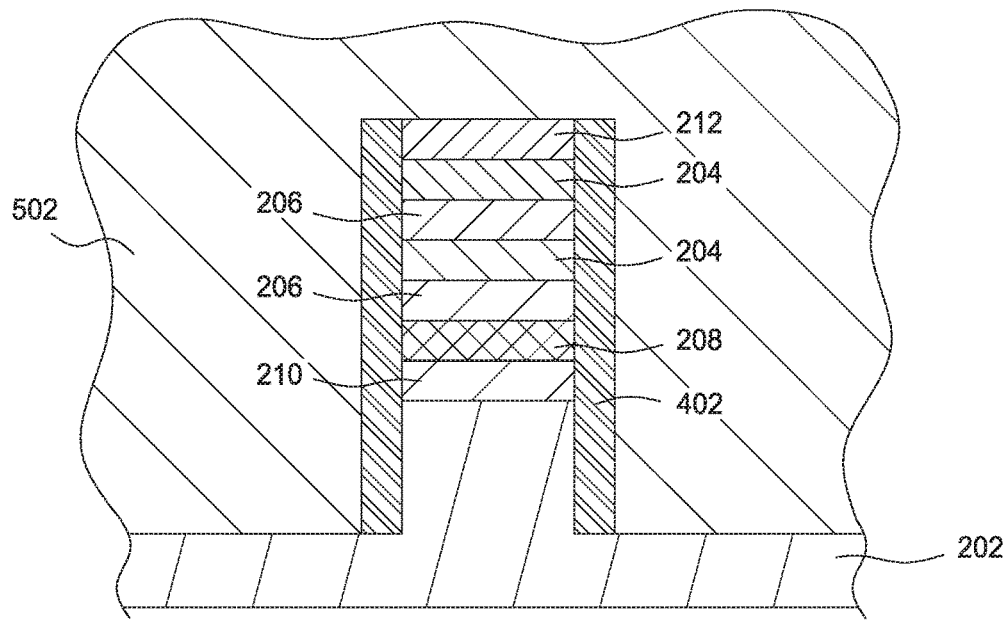
FIG. 5 illustrates a schematic, cross-sectional view of a portion of the substrate and superlattice structure of FIG. 4 after a shallow trench isolation (STI) process is performed.

FIG. 5 illustrates a schematic, cross-sectional view of a portion of the substrate 202 and superlattice structure 200 of FIG. 4 after a shallow trench isolation (STI) process is performed. The STI process is generally performed to electrically isolate at least one of the substrate 202 and/or the superlattice structure 200 from wells having different conductivity types (e.g., n-type or p-type) and/or adjacent transistor features (not shown) on the substrate 202. In one embodiment, the STI process may be a flowable CVD deposition process configured to deposit a dielectric material layer 502, such as a silicon oxide material or a silicon nitride material. The dielectric material layer 502 may be formed using a high-density plasma CVD system, a plasma enhanced CVD system, and/or a sub-atmospheric CVD system, among other systems. Examples of CVD systems that may be adapted to form the dielectric material layer 502 include the ULTIMA HDP CVD® system and PRODUCER® ETERNA CVD® system, both available from Applied Materials, Inc., of Santa Clara, Calif. It is contemplated that other suitable CVD systems from other manufacturers may also be utilized.

Figure 6:
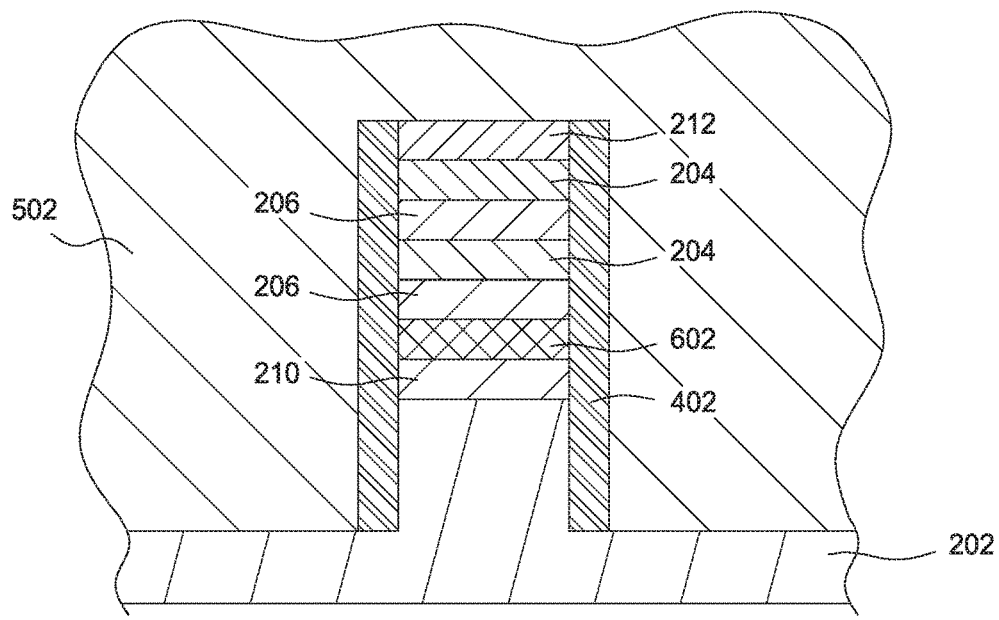
FIG. 6 illustrates a schematic, cross-sectional view of a portion of the substrate and superlattice structure of FIG. 5 after an annealing process is performed.

FIG. 6 illustrates a schematic, cross-sectional view of a portion of the substrate 202 and superlattice structure 200 of FIG. 5 after an annealing process is performed. The annealing process may be an STI annealing process configured to selectively oxidize one or more layers of the superlattice structure 200. The liner material 402 which prevented oxidation of the superlattice structure 200 during the STI formation process may provide for selective oxidation of one or more layers of the superlattice structure 200 during the annealing process.

For example, the annealing process may selectively oxidize the material layer 208. It is believed that the liner material 402 may prevent oxidation of relatively low germanium content layers, such as the material layer 210 and the plurality of second layers 206, while providing for oxidation of relatively high germanium content layers, such as the material layer 208. After selective oxidation, the material layer 208 is transformed into a buried oxide (BOX) layer 602. In one embodiment, oxidation of the material layer 208 to form the BOX layer 602 may also include oxidation of the material layer 210 as a result of the material layer's proximity to the material layer 208. However, in this embodiment, the plurality of second layers 206 may remain substantially unoxidized.

In one embodiment, the annealing process includes a steam annealing process. The steam annealing process may be performed at a temperature of between about 300 degrees Celsius and about 800 degrees Celsius, such as between about 500 degrees Celsius and about 600 degrees Celsius. The steam annealing process may be performed for an amount of time between about 15 minutes and about 180 minutes, for example, about 120 minutes.

In another embodiment, the annealing process may also include a dry annealing process. The dry annealing process may be performed at a temperature of between about 500 degrees Celsius and about 1000 degrees Celsius, such as between about 650 degrees Celsius and about 750 degrees Celsius. The dry annealing process may be performed for an amount of time between about 1 minute and about 60 minutes, for example, about 30 minutes. In yet another embodiment, both the steam annealing process and the dry annealing process may be utilized. In this embodiment, the dry annealing process may be performed after the steam annealing process.

Figure 7:
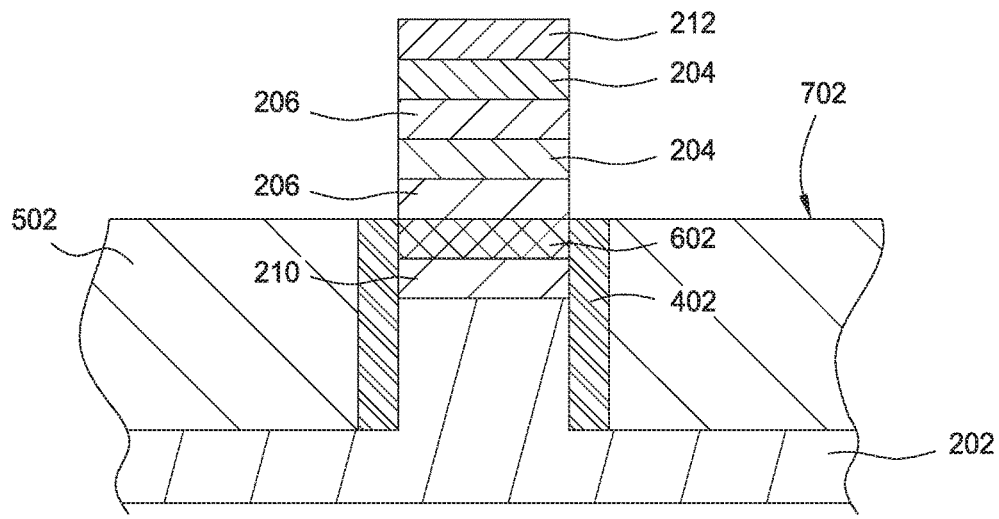
FIG. 7 illustrates a schematic, cross-sectional view of a portion of the substrate and superlattice structure of FIG. 6 after an STI recess process is performed.

FIG. 7 illustrates a schematic, cross-sectional view of a portion of the substrate 202 and superlattice structure 200 of FIG. 6 after an STI recess process is performed. Prior to performing the STI recess process, a planarization process may be performed. In one embodiment, a chemical mechanical polishing process may be performed to planarize the dielectric material layer 502 with the hardmask layer 212. In certain embodiments, the planarization process is optional.

The STI recess process is generally an etching process configured to remove at least a portion of the dielectric material layer 502. In one embodiment, a top surface 702 of the dielectric material layer 502 may be removed such that the top surface 702 is substantially co-planar with the BOX layer 602 or with an interface between the BOX layer 602 at one of the plurality of second layers 206. The STI recess process may also remove a portion of the liner material 402. In one embodiment, the STI recess process may be a remote plasma assisted dry etching process which exposes various materials disposed on the substrate 202 to $H_2$, $NF_3$, and $NH_3$ plasma by-products. The STI recess process is generally a conformal removal process and may be selective to silicon oxide materials but does not readily etch silicon. In one embodiment, the STI recess process may be performed by a SICONI® process and suitably configured apparatus, available from Applied Materials, Inc., Santa Clara, Calif. It is contemplated that other suitable etching processes and apparatus may also be utilized to perform the STI recess process.

After performing the STI recess process, subsequent hGAA processing operations may be performed. Advantageously, the BOX layer 602 is self-aligned to a bottom region of the superlattice structure 200. The self-aligned BOX formation process described herein advantageously improves transistor device performance and reduces transistor device variability by reducing or eliminating parasitic capacitance and leakage.

Figure 8:
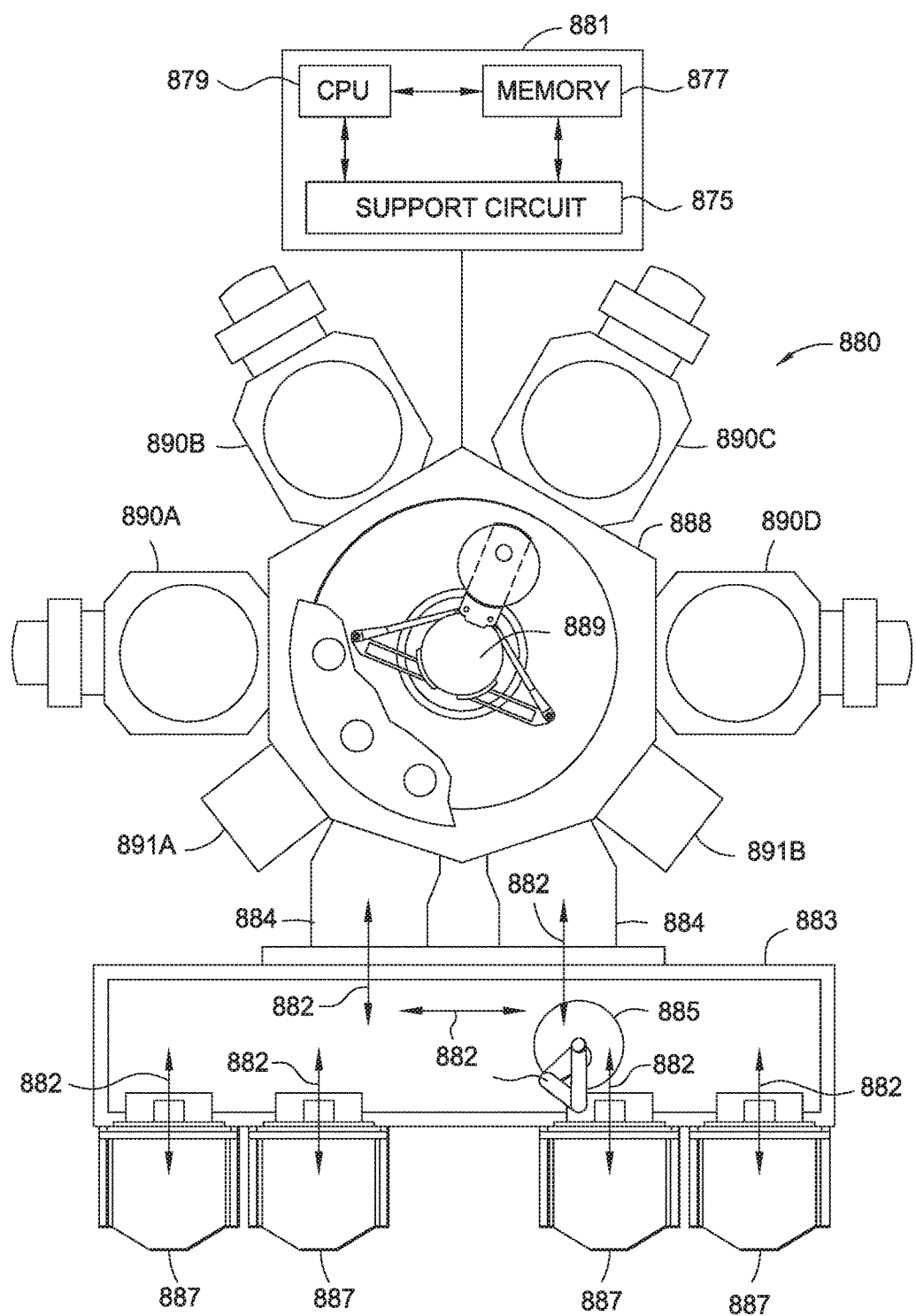
FIG. 8 illustrates a cluster tool which may be utilized in accordance with one or more of the embodiments described herein.

FIG. 8 illustrates a schematic, plan view of a cluster tool 880 suitable for performing one or more portions of the present disclosure. Generally, the cluster tool 880 is a modular system comprising multiple chambers (e.g., process chambers 890A-D, service chambers 891A-B, or the like) which perform various functions, including: substrate center-finding and orientation, degassing, annealing, deposition and/or etching.

The cluster tool 880 may include at least a semiconductor substrate process chamber configured to perform at least portions of the method 100 and may further include chambers such as ion implantation chambers, etch chambers, deposition chambers and the like. The multiple chambers of the cluster tool 880 are mounted to a central vacuum transfer chamber 888 which houses a robot 889 adapted to shuttle substrates between the chambers. The vacuum transfer chamber 888 is typically maintained at a vacuum condition and provides an intermediate stage for shuttling substrates from one chamber to another and/or to a load lock chamber 884 positioned at a front end of the cluster tool 880. A front-end environment 883 is shown positioned in selective communication with the load lock chambers 884. A pod loader 885 disposed in the front-end environment 883 is capable of linear and rotational movement (arrows 882) to shuttle cassettes of substrates between the load lock chambers 884 and a plurality of pods 887 which are mounted on the front-end environment 883.

The cluster tool 880 also includes a controller 881 programmed to carry out the various processing methods performed in the cluster tool 880. For example, the controller 881 may be configured to control flow of various precursor and process gases from gas sources and control processing parameters associated with material deposition or etching processes. The controller 881 includes a programmable central processing unit (CPU) 879 that is operable with a memory 877 and a mass storage device, an input control unit, and a display unit (not shown), such as power supplies, clocks, cache, input/output (I/O) circuits, and the like, coupled to the various components of the cluster tool 880 to facilitate control of the substrate processing. The controller 881 also includes hardware for monitoring substrate processing through sensors in the cluster tool 880. Other sensors that measure system parameters such as substrate temperature, chamber atmosphere pressure and the like, may also provide information to the controller 881.

To facilitate control of the cluster tool 880 described above, the CPU 879 may be one of any form of general purpose computer processor that can be used in an industrial setting, such as a programmable logic controller (PLC), for controlling various chambers and sub-processors. The memory 877 is coupled to the CPU 879 and the memory 877 is non-transitory and may be one or more of readily available memory such as random access memory (RAM), read only memory (ROM), floppy disk drive, hard disk, or any other form of digital storage, local or remote. Support circuits 875 are coupled to the CPU 879 for supporting the processor in a conventional manner. Deposition, etching, and other processes are generally stored in the memory 877, typically as a software routine. The software routine may also be stored and/or executed by a second CPU (not shown) that is remotely located from the hardware being controlled by the CPU 879.

The memory 877 is in the form of computer-readable storage media that contains instructions, that when executed by the CPU 879, facilitates the operation of the cluster tool 880. The instructions in the memory 877 are in the form of a program product such as a program that implements the method of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

For the purposes of practicing embodiments of the present disclosure, at least one of the processing chambers (for example, 890A) of the cluster tool 880 may be configured to perform an etch process, a second processing chamber (for example 890B) may be configured to perform a cleaning process and a third processing chamber (for example 890C) may be configured to perform a epitaxial deposition process. A cluster tool having the recited configuration may advantageously prevent unwanted oxidation after the source/drain recess is etched and reduces or eliminates subsequent cleaning of oxidized surfaces prior to epitaxial deposition. In some embodiments, at least one of the processing chambers (for example, 890A) of the cluster tool 880 may be configured to perform a selective etch process, and a second processing chamber (for example 890B) may be configured to perform a deposition process, for example deposition of a dielectric material. A cluster tool having the recited configuration may advantageously prevent oxidation of the channel structure upon exposure of the hGAA channel.

While the foregoing is directed to embodiments of the present disclosure, other and further embodiments of the disclosure may be devised without departing from the basic scope thereof, and the scope thereof is determined by the claims that follow.

What is claimed is:

1. A method of forming a semiconductor device, comprising:
    forming a superlattice structure on a substrate, wherein the superlattice structure comprises:
        a silicon containing material layer;
        a first silicon germanium material layer having a first germanium content; and
        a second silicon germanium material layer having a second germanium content greater than the first germanium content of the first silicon germanium material layer;
    etching the superlattice structure;
    depositing a liner on the superlattice structure;
    depositing an oxide material layer on the substrate after depositing the liner; and
    oxidizing one of the first material layer, the second material layer, or the third material layer to form a buried oxide layer after depositing the oxide material layer, wherein the liner selectively prevents oxidation of two of the material layers preferentially to the material layer which forms the buried oxide.

2. The method of claim 1, wherein the silicon containing material layer and the first silicon germanium material layer are disposed within the superlattice structure in an alternating stacked arrangement.

3. The method of claim 1, wherein the first silicon germanium material layer comprises about 70% silicon and about 30% germanium, and the second silicon germanium material layer comprises about 30% silicon and about 70% germanium.

4. The method of claim 1, wherein the first silicon germanium material layer is disposed on the substrate and the second silicon germanium material layer is disposed on the second material layer.

5. The method of claim 1, wherein the substrate comprises a silicon containing material.

6. The method of claim 1, wherein depositing the liner comprises:
    performing a chemical vapor deposition nitridation process.

7. The method of claim 1, wherein depositing the liner comprises:
    performing an atomic layer deposition nitridation process.

8. The method of claim 1, wherein depositing the oxide material layer comprises:
    performing a flowable chemical vapor deposition process to deposit the oxide material layer.

9. The method of claim 1, wherein the oxidizing comprises:
    performing a steam annealing process at a temperature of between about 300° C. and about 800° C.

10. The method of claim 9, further comprising:
    performing a dry annealing process after the steam annealing process, the dry annealing process performed at a temperature of between about 500° C. and about 1000° C.

11. A method of forming a semiconductor device, comprising:
forming a superlattice structure on a substrate, wherein the superlattice structure comprises:
a silicon material layer;
a low germanium content silicon germanium material layer; and
a high germanium content silicon germanium material layer;
etching the superlattice structure;
depositing a nitride liner on the superlattice structure;
depositing an oxide material layer on the substrate; and
oxidizing the high germanium content silicon germanium material layer to form a buried oxide layer, wherein the nitride liner selectively prevents oxidation of the silicon material layer and the low germanium content silicon germanium layer.

12. The method of claim 11, wherein the silicon material layer and the low germanium content silicon germanium material layer are disposed within the superlattice structure in an alternating stacked arrangement.

13. The method of claim 11, wherein the low germanium content material layer comprises about 70% silicon and about 30% germanium and the high germanium content material layer comprises about 30% silicon and about 70% germanium.

14. The method of claim 12, wherein the high germanium content silicon germanium material layer is disposed on the substrate.

15. The method of claim 12, wherein the low germanium content silicon germanium material layer is disposed on the substrate and the high germanium content material layer is disposed on the low germanium content material layer.

16. The method of claim 11, wherein oxidizing the high germanium content silicon germanium material layer comprises:
performing a steam annealing process at a temperature of between about 300° C. and about 800° C.; and
performing a dry annealing process after the steam annealing process at a temperature of between about 500° C. and about 1000° C.

17. A method of forming a semiconductor device, comprising:
forming a superlattice structure on a substrate, wherein the superlattice structure comprises:
a silicon material layer;
a first silicon germanium material layer comprising about 30% germanium; and
a second silicon germanium material layer comprising about 70% germanium, wherein the silicon material layer, the first silicon germanium material layer, and the second silicon germanium layer are disposed in a stacked arrangement;
depositing a nitride liner on the superlattice structure;
depositing an oxide material layer on the substrate; and
oxidizing the second silicon germanium material layer to form a buried oxide layer, wherein the nitride liner selectively prevents oxidation of the silicon material layer and the first silicon germanium material layer.

18. The method of claim 17, wherein oxidizing the second silicon germanium material layer comprises:
performing a steam annealing process at a temperature of between about 300° C. and about 800° C.

19. The method of claim 18, further comprising:
performing a dry annealing process after the steam annealing process at a temperature of between about 500° C. and about 1000° C.

* * * * *